United States Patent [19]

Plester et al.

[11] Patent Number: 5,565,248
[45] Date of Patent: Oct. 15, 1996

[54] METHOD AND APPARATUS FOR COATING HOLLOW CONTAINERS THROUGH PLASMA-ASSISTED DEPOSITION OF AN INORGANIC SUBSTANCE

[75] Inventors: George Plester, Brussels, Belgium; Horst Ehrich, Dorsten, Germany

[73] Assignee: The Coca-Cola Company, Atlanta, Ga.

[21] Appl. No.: 194,225

[22] Filed: Feb. 9, 1994

[51] Int. Cl.⁶ ................................ H05H 1/02
[52] U.S. Cl. ............... 427/571; 118/50.1; 118/620; 118/716; 118/723 VE; 118/723 MR; 118/723 MA; 427/237; 427/238; 427/248.1; 427/294; 427/585; 427/598
[58] Field of Search ..................... 427/294, 571, 427/598, 248.1, 237, 238, 585; 118/716, 723 VE, 723 MR, 723 MA, 50.1, 620

[56] References Cited

U.S. PATENT DOCUMENTS

| | | |
|---|---|---|
| 4,401,054 | 8/1983 | Matsuo et al. . |
| 4,478,874 | 10/1984 | Hahn . |
| 4,569,738 | 2/1986 | Kieser et al. . |
| 4,585,668 | 4/1986 | Asmussen et al. . |
| 4,599,135 | 7/1986 | Tsunekawa et al. . |
| 4,667,620 | 5/1987 | White . |
| 4,698,234 | 10/1987 | Ovshinsky et al. . |
| 4,715,937 | 12/1987 | Moslehi et al. . |
| 4,737,379 | 4/1988 | Hudgens et al. . |
| 4,752,426 | 6/1988 | Cho . |
| 4,756,964 | 7/1988 | Kincaid et al. . |
| 5,041,303 | 8/1991 | Wertheimer et al. . |

FOREIGN PATENT DOCUMENTS

| | | |
|---|---|---|
| 3632748A1 | 4/1988 | Germany . |
| 3908418A1 | 9/1990 | Germany . |
| 55-094474 | 7/1980 | Japan . |
| WO93/24243 | 12/1993 | WIPO . |

*Primary Examiner*—Bernard Pianalto
*Attorney, Agent, or Firm*—Birch, Stewart, Kolasch & Birch, LLP

[57] ABSTRACT

A plasma assisted deposition of a very thin inner surface coating inside a plastic or metal container is achieved using insoluble, inert, inorganic substances such as silica, or insoluble metal oxides, or by using mixtures of substances, for example of metals, metal oxides, metal salts and carbon and/or organic radicals, so as to form a flexible structure or lattice, or by using different layers of such structures. It involves locating the container in an evacuated enclosure, placing a vaporizer containing inert inorganic material of a predetermined constituency inside the container, generating a vapor of said material, forming a plasma of said vapor, and depositing a relatively thin coating of said material over a predetermined area of an inside surface of said container, whereby the high temperature of the particles of said coating penetrate said surface due to their heat energy while causing no overall rise in surface temperature because of the low mass flow.

23 Claims, 8 Drawing Sheets

METHOD AND APPARATUS FOR COATING HOLLOW CONTAINERS THROUGH PLASMA-ASSISTED DEPOSITION OF AN INORGANIC SUBSTANCE

BACKGROUND OF THE INVENTION

This invention relates generally to hollow containers with inert or impermeable, i.e. glass-like, inner surfaces and more particularly to such containers produced by a plasma assisted application of a thin internal coating comprised principally of one or several inert inorganic substances, or layers of substances, such as silica or corrosion-resistant metal oxides or metals, and which can include carbon or an organic component to provide additional elasticity, where necessary.

Plastic and metal containers have been replacing glass in many applications where easy handling, low weight and non-breakability are needed. Where metal is used, the internal metal surface of the container must often be coated with a polymer to avoid contact of the packaged content with the metal. Therefore, in the case of plastic packages, and also in case of many metal containers, the contact surface with the packaged content is a polymer. Polymers to date have had varying degrees of inertness to the packaged content which differ from the inertness of glass. In the case of food packages, surface inertness helps diminish potential desorption of packaging material components into the food, to prevent flavor-absorption, to avoid loss of food constituents through the package walls and to avoid ingress of air or other substances from outside the package. All these characteristics of inertness apply to plastic containers; however, some of these characteristics also apply to metal containers which have been internally coated with a plastic or lacquer system.

Refillable plastic packages add a further dimension to inertness requirements because these packages must withstand washing and refilling. Such containers should not absorb contact materials such as the washing agents or foreign materials stored in the container.

Recycling is yet another dimension with mass-produced packages. The reuse of recycled plastic for same purpose, that is to produce new containers ("closed-loop"recycling) is an issue which has attracted much attention, and for PET, this has been achieved to date by depolymerizing the recycled material in order to free it of all trace contaminants, which might otherwise migrate and come in contact with the container content. An impermeable inner layer, which is the purpose of this invention, would enable recycled material to be reused directly for new containers, i.e. without special treatment such as depolymerization, since traces of foreign substances could no longer contact the container's content. This would simplify the "closed-loop"recycling process considerably by obviating the need for depolymerization.

Furthermore, recyclability within established recycling systems, both "open loop", i.e. recycling for other uses, or "closed loop", i.e. reuse for same purpose, is necessary for any mass-produced package. In "open loop" systems, the normal method is to separate, clean and chop up the plastic into small flakes. The flake is then either melted and used for molding other objects, or for fibre production. For this form of recycling, it is important that any contaminant to the main plastic, such as a coating, should effectively be present in negligible quantities and, preferably, be solid and insoluble within the molten plastic so that it can be filtered off prior to sensitive applications, such as fibre-production. PET is also recycled in "closed loop" by depolymerization and it is important that the coating material should be unchanged by this process, be insoluble in the monomers resulting from the process, and be easily separable from these monomers. An inert, thin inorganic coating fulfills these criteria.

Packages utilized for carbonated beverages are also pressurized and must withstand considerable mechanical stress in handling. It is therefore difficult for a single material to provide the necessary mechanical stability and the required inertness. Current plastic packages for carbonated beverages either consist of a single material such as polyethylene terephthalate (PET), or are comprised of multi-layer structures where the middle layers normally provide the barrier properties and the outer layers provide the mechanical strength properties. Such containers are typically produced either by co-injection or co-extrusion.

To date, plastic containers with an impermeable, dense "glass-like" inner surface have not been able to be produced by conventional methods. Prior art is typically comprised of a coating of plastic film using silicon oxides or silicon nitride. However, no method has emerged for satisfactorily coating the inside of bottles or cans, or for providing the degree of surface inertness described.

SUMMARY OF THE INVENTION

Accordingly, it is an object of this invention to provide an inner coating or layer for plastic or metal containers, but particularly for refillable plastic containers used for carbonated beverages and having the following properties: glass-like impermeability to polar and non-polar substances; elasticity so as to maintain coating integrity both when container walls flex or stretch under pressure and when walls are indented; adequate durability and adhesion, during working life, when the inner-surface of container is rubbed, scuffed, or abraded, for example during filling, pouring or normal use; good transparency so as not to affect the appearance of the clear plastic container; resistance against high/low pH in case of refillable containers for carbonated beverages; safe contact with food for contents such as beverages; and recyclability of container material without adverse effects.

The foregoing and other objects of this invention are fulfilled by a method and apparatus for plasma assisted deposition of a very thin, typically 10–250 nm, inner surface coating in a plastic or metal container using insoluble, inert, inorganic substances such as silica, or insoluble metal oxides, or by using mixtures of substances, for example of metals, metal oxides, metal salts and carbon and/or organic radicals, so as to form a flexible structure or lattice, or by using different layers of such structures. To enable coating of heat sensitive plastic containers with coating materials which can only be vaporized at very high temperatures, the invention provides for coating without unacceptable increase in plastic substrate surface temperature. Plasma assistance enables penetration of the coating beneath the plastic substrate surface or for formation of free radicals for good adhesion between coating and substrate.

Furthermore, the method described herein enables surface pre-treatment for additional free-radical formation and surface cleaning, before coating begins, if this is necessary to improve adhesion. Further, the method described provides for mixtures of substances to be deposited thus forming a lattice which by virtue of its varied composition can provide the complete range of high-quality requirements of impermeability, flexibility, adhesion, inertness, transparency and durability.

The form of deposition, which provides for approximately 90° approach angle of plasma particles to surface and moves plasma source relative to surface, helps avoid that surface imperfections/unevenness can lead to gas inclusion or porosity and also uses plasma energy to full effect for producing an even, dense deposit. This is additionally assisted by the control of rate or deposition and of plasma quality, by inclusion of an inert gas.

The method described herein also enables that gas inclusions and porosity can be avoided by coating the primary structure or surface-lattice with further, different structures, since these can be designed to fill gaps, which the original lattice sometimes leaves by tending to build on its own foundation. The apparatus described furthermore enables an after-treatment, with appropriate inert or reactive gases, so as to rearrange the surface of the deposit and further reduce gas inclusion, if necessary. Flexibility and transparency are ensured by applying a very thin deposit in a controlled manner.

The method of coating the inner surface of a container according to the present invention comprises the steps of: (a) locating the container in an evacuated enclosure; (b) placing one or more vaporizers containing one or more inert inorganic substances of a predetermined constituency inside container; (c) generating a vapor of said material; (d) forming a plasma of said vapor; and (e) depositing a relatively thin coating of said material over a predetermined area of an inside surface of said container, whereby the high temperature of the particles of said coating penetrate said surface due to their heat energy while causing no overall rise in surface temperature because of the low mass flow.

An apparatus for performing the aforementioned method steps comprises: (a) apparatus for coating an inner surface of a temperature sensitive container comprising: (b) a vacuum chamber; (c) a vaporizer or a plurality of vaporizers containing inert inorganic material of a predetermined constituency; (d) means for inserting and removing the vaporizer from inside the container; (e) means for moving the vaporizer while inside the container; (f) means for energizing the vaporizer; (g) means for introducing a gas or mixture of gases into the container; and (h) means for forming a plasma of the vapor formed in the vaporizer and/or the gases or mixture thereof.

BRIEF DESCRIPTION OF THE DRAWINGS

The present invention will be more readily understood from the detailed description given hereinbelow and the accompanying drawings which are given by way of illustration only, and thus, are not limitative of the present invention and wherein.

DETAILED DESCRIPTION OF THE INVENTION

Figure 1:
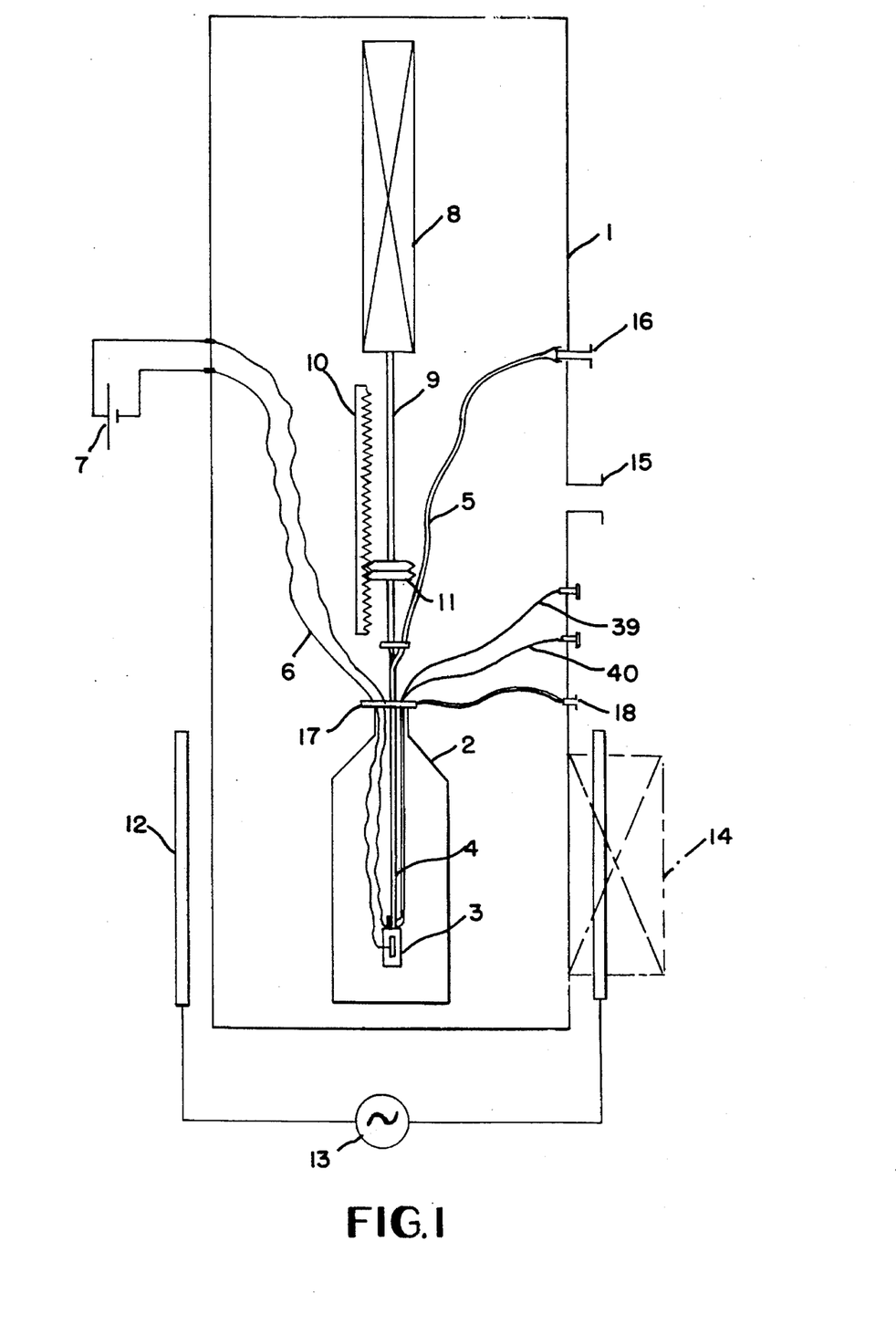
FIG. 1 is an electro-mechanical schematic diagram broadly illustrative of the invention.

FIG. 1 is illustrative of a basic embodiment of this invention and depicts a system for coating hollow containers, particularly PET containers, which are temperature sensitive.

As shown, a high-vacuum enclosure 1 encloses a container 2 to be coated. The coating material, for example a silicon oxide, nitride or metal is placed in a vaporizer 3 within the container 2. A gas supply coupling 16, for supplying a gas mixture, for example oxygen and an inert gas such as argon, is connected to the vaporizer 3. The gas is ducted by a flexible tube 5 and a non-flexible tube 4 to the vaporizer 3. The vaporizer 3 is activated by a DC power supply 7 which is coupled to the vaporizer by the wiring 6. The power supply 7 is further controlled to provide the required evaporation rate.

In order to provide good coating distribution and depending on shape and/or size of the container 2, the vaporizer 3 may be moved up or down within the container 2 and is capable of being rotated, typically through 30° to 90°. This motion is provided by a simple solenoid 8 and pusher mechanism including a push rod 9 to which is attached a rotating helix 11 which meshes with a fixed helix 10.

The vapor produced by the vaporizer 3 is energized to form a plasma by applying a high frequency potential to electrodes 12 connected to a high frequency 13 outside the container 2 and the vacuum enclosure 1. A further embodiment, enabling better energy utilization and a greater degree of plasma generation is to connect one terminal of the high-frequency generator 13 to the non-flexible (metal) tube 4 via push rod 9, thus enabling direct contact of one of the electrodes 12 with the plasma. A further embodiment, enabling plasma generation at very low pressures is to connect tube 4 to a high DC potential and provide a negative terminal by earthing the enclosure 2 so that an electrical discharge between the two terminals forms a plasma. The plasma thus generated then deposits onto the inner surface of the container 2.

Where a gas supply is needed, this gas can also be formed into a plasma and will react with the vapor from the vaporizer 3 to provide a coating composition different from that of the material being vaporized. Furthermore, a gas may be generated to form a plasma which is used to clean and/or prepare the surface to be coated before vaporizer 3 is energized and coating deposition commences.

A microwave generator 14, also positioned outside the vacuum enclosure !, can be used, when desirable, in place of the high frequency generator 13. The vacuum enclosure 1 also includes a coupling 15 for a vacuum supply, not shown. Typically a vacuum source between $10^{-1}$ mbar and $10^{-5}$ mbar is utilized. A separate vacuum can be generated inside container 2 by means of an adaptor 17 which seals the container opening and is connected to a second vacuum source 18. This enables the system to maintain ideal vacuum conditions both inside and outside container 2. In particular, it enables the plasma generating energy, which is applied externally to enclosure 1, to be utilized only within the container 2 where it is needed and not dissipated outside container 2. This is a factor which affects the degree of plasma generation within container 2 and thus the quality of deposit. Also, avoiding plasma generation outside container 2 eliminates possible unwanted surface changes on the external surface of container 2.

The vaporizer 3 operates at high temperatures, typically at the sublimation or evaporation temperature of the material being vaporized. This energy must be reduced to a minimum and confined to avoid heating the surface of the container 2. The energy is reduced by the choice of material, by radiant reflecting shielding, and by reducing the rate of evaporation. Some materials sublimate at low temperature while some vaporize only at high temperature. The energy is confined by cooling. In this embodiment, cooling is accomplished by gas being supplied to connector 16 and/or by cooling water being supplied via connectors 39 and 40. Evaporative cooling is also possible using basically the same water connectors 39 and 40.

The technology described up to this point enables the deposition of a high temperature vapor, such as silica, glass and metal onto a heat-sensitive surface without raising the surface temperature because the high vacuum reduces the heat flux at the surface. However, the high temperature of the individual particles and the positioning of the vaporizer relative to the plastic surface so that the particles approach the surface close to an angle of 90°, enables them to penetrate and "become imbedded" into the plastic surface thus providing good adhesion between materials such as plastic and silica, where neither normally has an affinity for the other. The very thin coating application (10–250 nm) enables flexibility even when coating materials used are brittle, e.g. silica or glass. The thin coating also ensures transparency, even when materials are normally opaque. The good adhesion of the coating due to the penetration of the plastic surface, enables coating integrity in spite of flexing of walls. Therefore, the system enables plastic containers to be coated with coating materials which hitherto could not be applied thereto because of the problems of flexing, adhesion, transparency and above all, application temperature.

The foregoing has been described with a view to optimizing coating integrity and has the capability of providing the following conditions: coating evenness over whole container surface by moving and rotating the vaporizer; avoiding surface imperfections that can cause "shadowing" and poor coating in area of shadow and being achieved by the movement of vaporizer; avoiding gas inclusions by producing a highly reactive gas plasma before introducing it at the gas supply inlet and by providing control of evaporation rate; avoiding dirt inclusion by using gas plasma to preclean the surface; avoiding delamination by pretreating surface of container to induce free radicals, where the surface is a polymer, avoiding heat damage to the container, e.g. melting/shrinking, by cooling the vaporizer; and ensuring separate control of pressure inside and outside the container to provide best plasma assisted conditions.

Figure 2A:
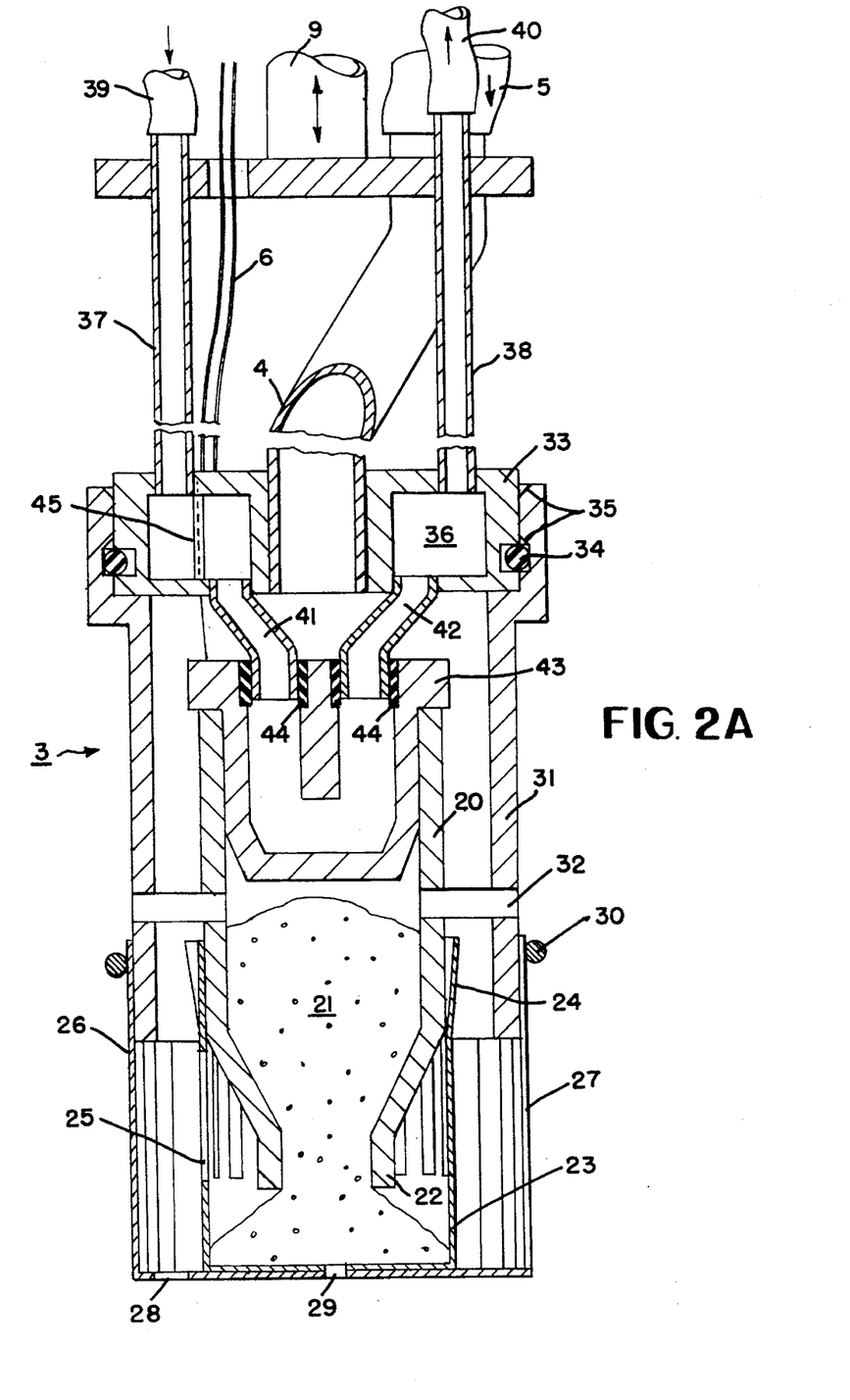
FIG. 2A is a central longitudinal cross-sectional view of one embodiment of a vaporizer device shown in FIG. 1, and being usable for handling free-flowing powders.
Figure 3A:
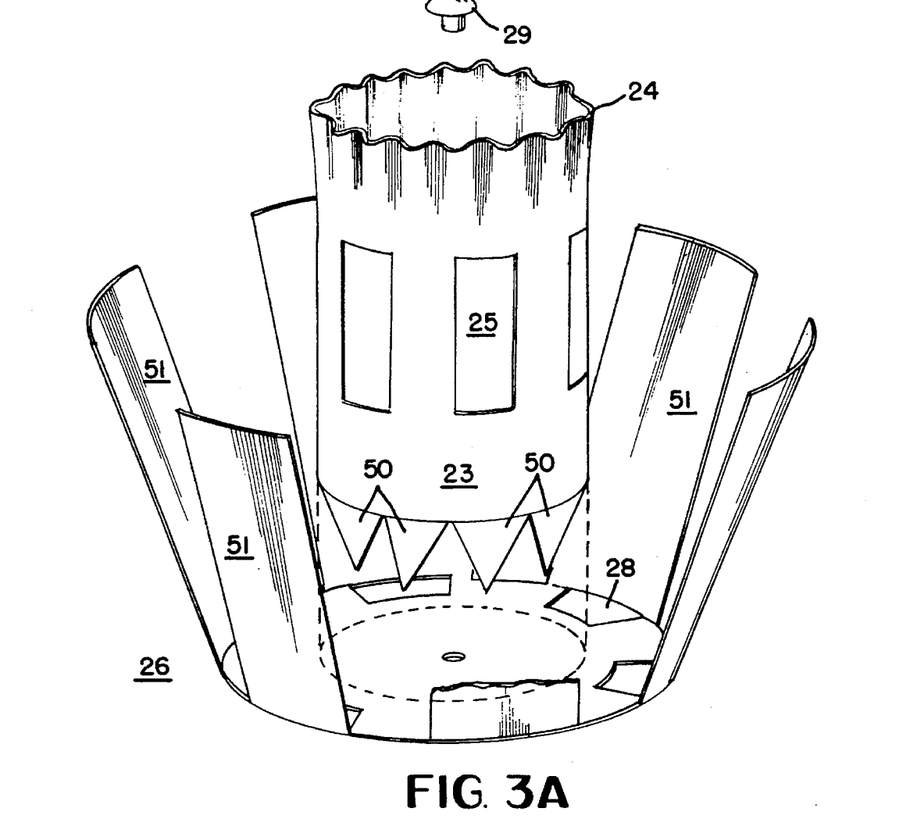
FIGS. 3A and 3B are perspective and top planar views respectively of the crucible and inner container therefor shown in FIG. 2A.
Figure 3B:
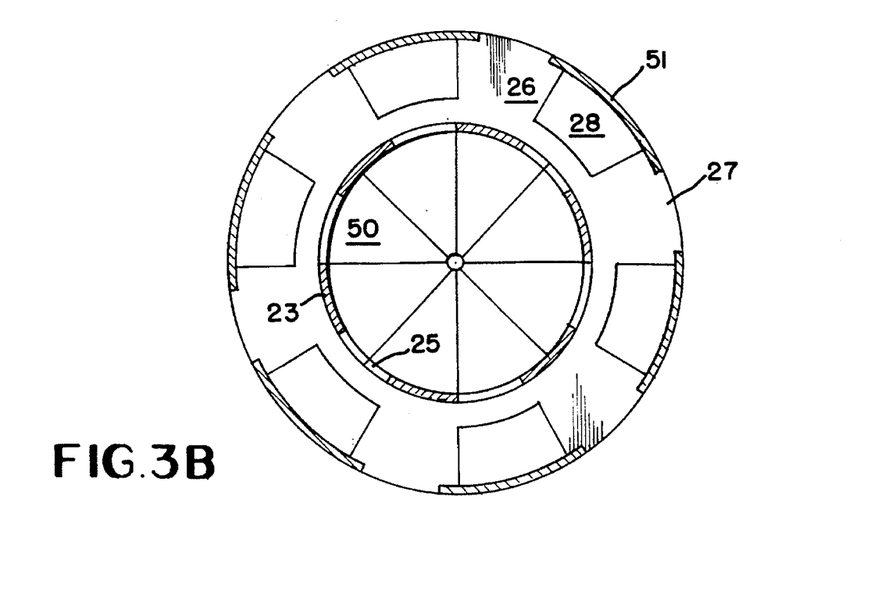

Referring now to FIG. 2A as well as FIGS. 3A and 3B, shown thereat are the details of the vaporizer 3. A crucible 26, shown in greater detail in FIGS. 3A and 3B, makes electrical contact with an inner tube 20 and is fixed to an outer tube 31 by a clip 30. The electrical contact is made by the inner container 23, 24 of the crucible 26, which in turn is attached to the outer container 51 by a rivet 29. The inner container 23 of the crucible 26 has vertical slots or vents 25 to enable the outward flow of vapor. The outer container 51 of the crucible 26 also has vertical slots 27 and horizontal slots 28 to enable outward flow of vapor. The slots thus can be positioned so as to distribute vapor evenly in all directions.

The crucible 26 and inner tube 20 is filled with the material 21 to be vaporized and deposited as shown in FIG. 2A. The inner tube 20 is necked-in at its base 22 so as to provide a controlled flow and quantity of material 21 into the base of the crucible 26. The inner tube 20 is separated and fixed to the outer tube 31 by non electrical conducting pins 32. The top of the inner tube 20 has a cooling water distributor 43 which makes good thermal and electrical contact with inner tube 20. A cooling water distributor 43 is plugged into the cooling water connecting pipes 41 and 42, the connection being via tight fitting, non-conducting sleeves 44. The distributor 43 also includes a DC power connector 45. The outer tube 31 together with the inner tube 20, the cooling-water distributor 43 and the crucible 26 form a single unit which can be easily pulled out, or replaced by pressure against fitting 33 and which is held in position by a spring clip 34. This single unit thus can be removed, cleaned, refilled with material 21 and replaced as needed. The top fitting 33 includes flow pipes 37 and 38 for cooling water, a gas inlet pipe 4 and the push rod 9. The material for the crucible 26 is chosen according to the material to be vaporized 21 and is high temperature tolerant with typical examples being tungsten and molybdenum.

Figure 2B:
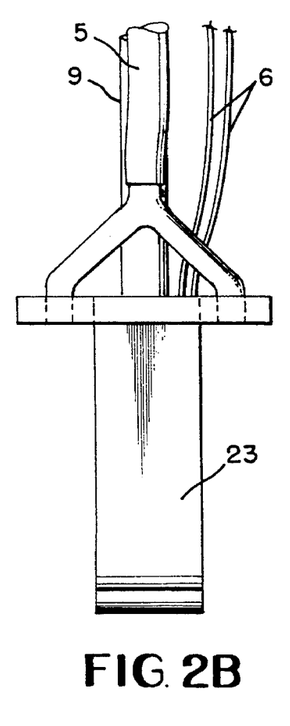
FIGS. 2B and 2C are side elevational and central cross sectional views of another embodiment of a vaporizer device shown in FIG. 1 and being usable for certain powders and low coating weights.
Figure 2C:
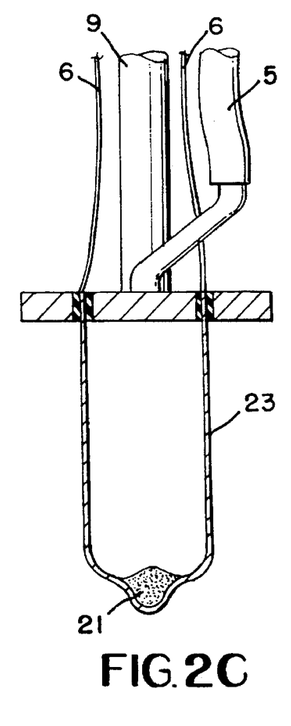

Referring now to FIGS. 2B and 2C, they illustrate two views of a simple variant of the vaporizer 3 which is usable for certain powders. The inner container 23 is now a simple folded metal strip, shaped in a manner shown by FIG. 2B. The material 21 to be evaporated is placed in a hollow cup type region at the bottom of this folded strip. The push rod 9, the gas supply via flexible tube 5 and the power supply 6 are as already described.

Figure 2D:
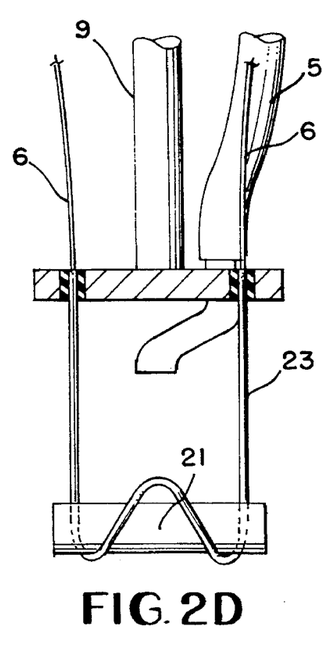
FIGS. 2D and 2E are front and side elevational views of a further embodiment of a vaporizer device shown in FIG. 1, also being usable for certain powders and low coating weight.
Figure 2E:
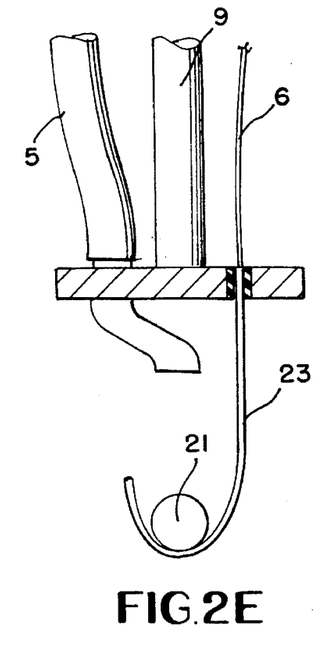

FIGS. 2D and 2E depict two views of a further variant of the vaporizer 3 which is usable, for example, for metal pieces. The container 23 is now a simple folded wire, shaped in the manner shown. The material 21, to be evaporated, is placed within a cradle formed in the wire. The push rod 9, gas supply via flexible tube 5 and power supply 6 are as already described.

Figure 2F:
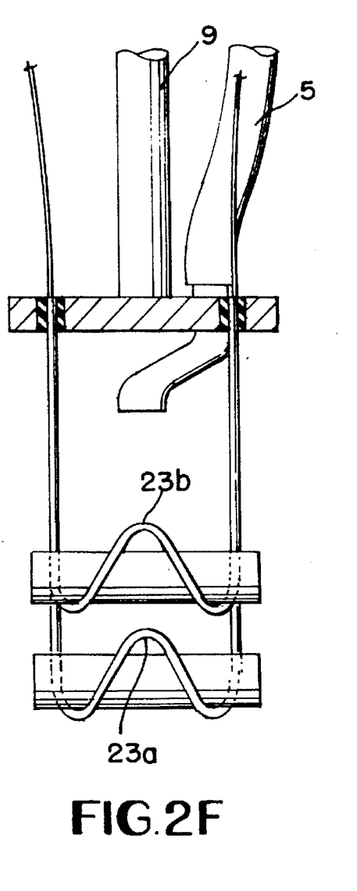
FIGS. 2F and 2G are front and side elevational views of an embodiment of a vaporizer shown in FIG. 1 and being usable for separate vaporization of more than one substance.
Figure 2G:
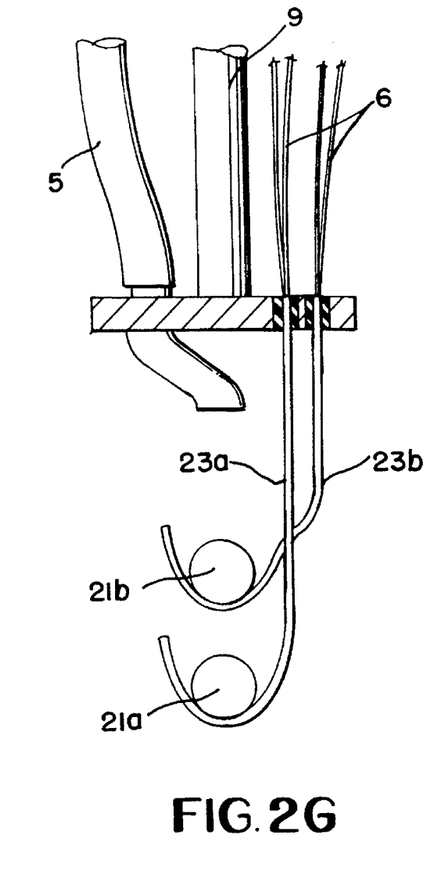

FIGS. 2F and 2G show two views of a multiple vaporizer 3 which enables more than one material, (e.g. materials 21a and 21b, to be vaporized simultaneously. The form of each vaporizer container 23 can take any desired form such as a double configuration comprised of units 23a and 23b as shown. Each of the containers 23a and 23b are independently connected to power supply leads 6 and can be independently controlled.

Figure 4A:
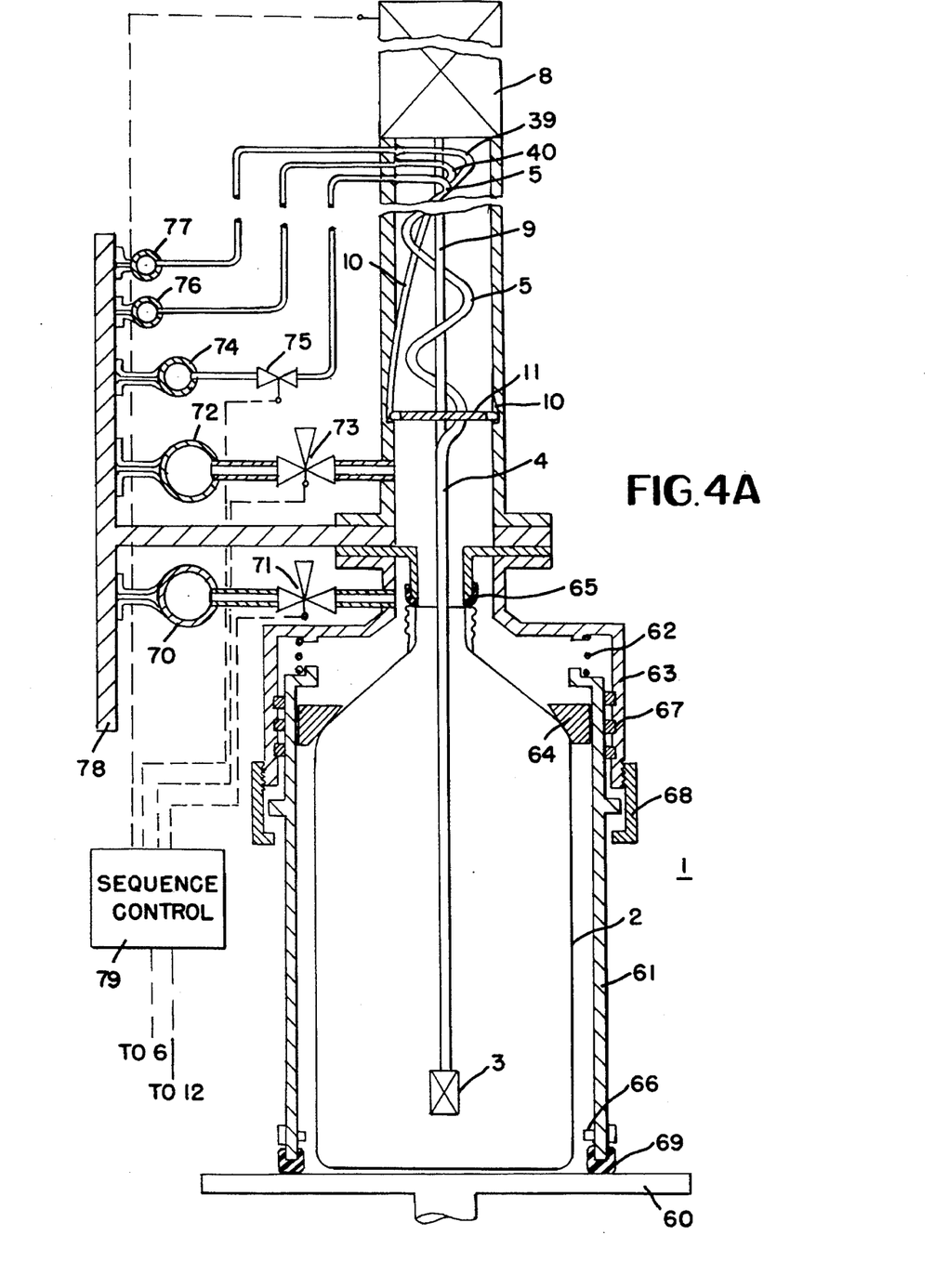
FIG. 4A is a central longitudinal cross sectional view of the preferred embodiment of the invention.

FIG. 4A is illustrative of the preferred embodiment of the invention and, in addition to the crucible assembly 3 shown in FIG. 2A located in the vacuum chamber 1, includes, among other things, a container elevator 60, a vacuum sleeve 61 which is fitted with a spring 62, sliding sealing rings 67, a rubber sealing ring 69, and a vacuum sleeve head 63. The container 2 can be pushed upwards by the elevator 60 until its progress is stopped by the container opening sealing ring 65. The container 2 is centered and guided by sliding guide 64. The spring-loaded assembly of the vacuum sleeve 61 is secured by a cap 68 which also pre-compresses the spring 62 and connects to the vacuum sleeve head 63. Pins 67 ensure that the sliding bottle guide 64 remains in place. The vacuum sleeve head 63 is secured to a bracket assembly 78 and is adapted to hold the push rod 9, its solenoid motor 8, the gas tube 5 and all the other functions connected to the fitting 33 (FIG. 2A) of the vaporizer 3.

The bracket assembly 78 has a distributor pipe 70 for a vacuum source external to container 2, and a distributor pipe 72 for a vacuum source internal to the container 2. These members are connected via control valves 71 and 73 respectively. Control valves 71 and 73 enable a vacuum to be applied by a sequence controller 79 as soon as the opening of container 2 seals against seal 65, and to release the vacuum when the container 2 is ready for removal from device.

Figure 4B:
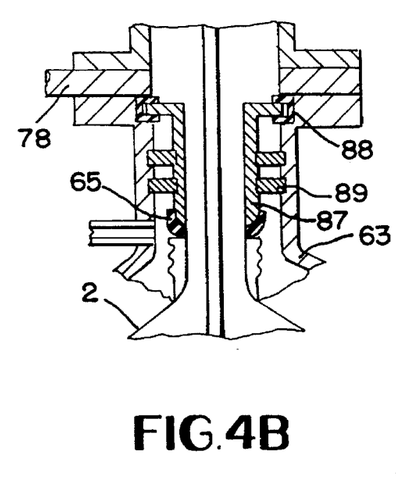
FIGS. 4B and 4C are partial central longitudinal cross sectional views of modifications of the apparatus shown in FIG. 4A.
Figure 4C:
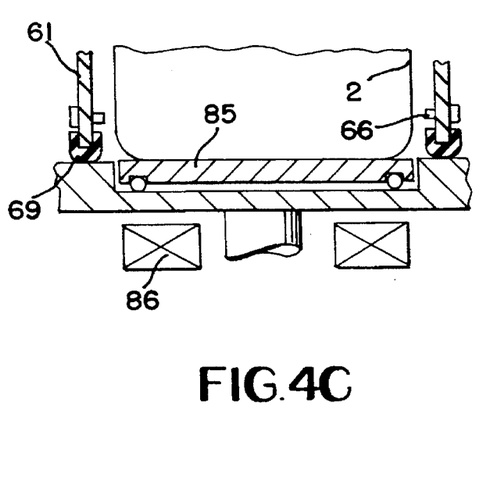

The bracket assembly 78 also has a gas distributor 74 which connects to gas pipe 5 via an on-off valve 75 which is also connected to sequence controller 79. Cooling water distributor pipes 77 and 76 are also fixed to the bracket 78 and are piped to the vacuum sleeve head 63. The sequence controller 79 works on a machine cam and is mechanically connected to a machine timing mechanism, not shown. It also sequences the switching of DC power to the wiring 6 connected to the vaporizer 3 and the switching of the plasma activator 13 or 14 shown in FIG. 1.

Where the plasma-generating energy is high and the temperature-stability of container 2 is inadequate, container 2 must be rotated to avoid the energy being concentrated on the walls of container 2 nearest to the plasma-generating sources 12 or 13. For example, the container 2 may be rotated within the device shown in FIG. 4A by the means illustrated by FIGS. 4B and 4C. The base of container 2 rests on a freely-rotating steel platform 85, in which a permanent magnet is embedded, and which is made to rotate by an external electromagnetic field 86 generated by a coil shown in FIG. 4C. At the top of container 2 as shown in FIG. 4B, the sealing ring 65 is mounted on a sleeve 87, which is free to rotate within a recess 88 and is sealed by rings 89.

Figure 5:
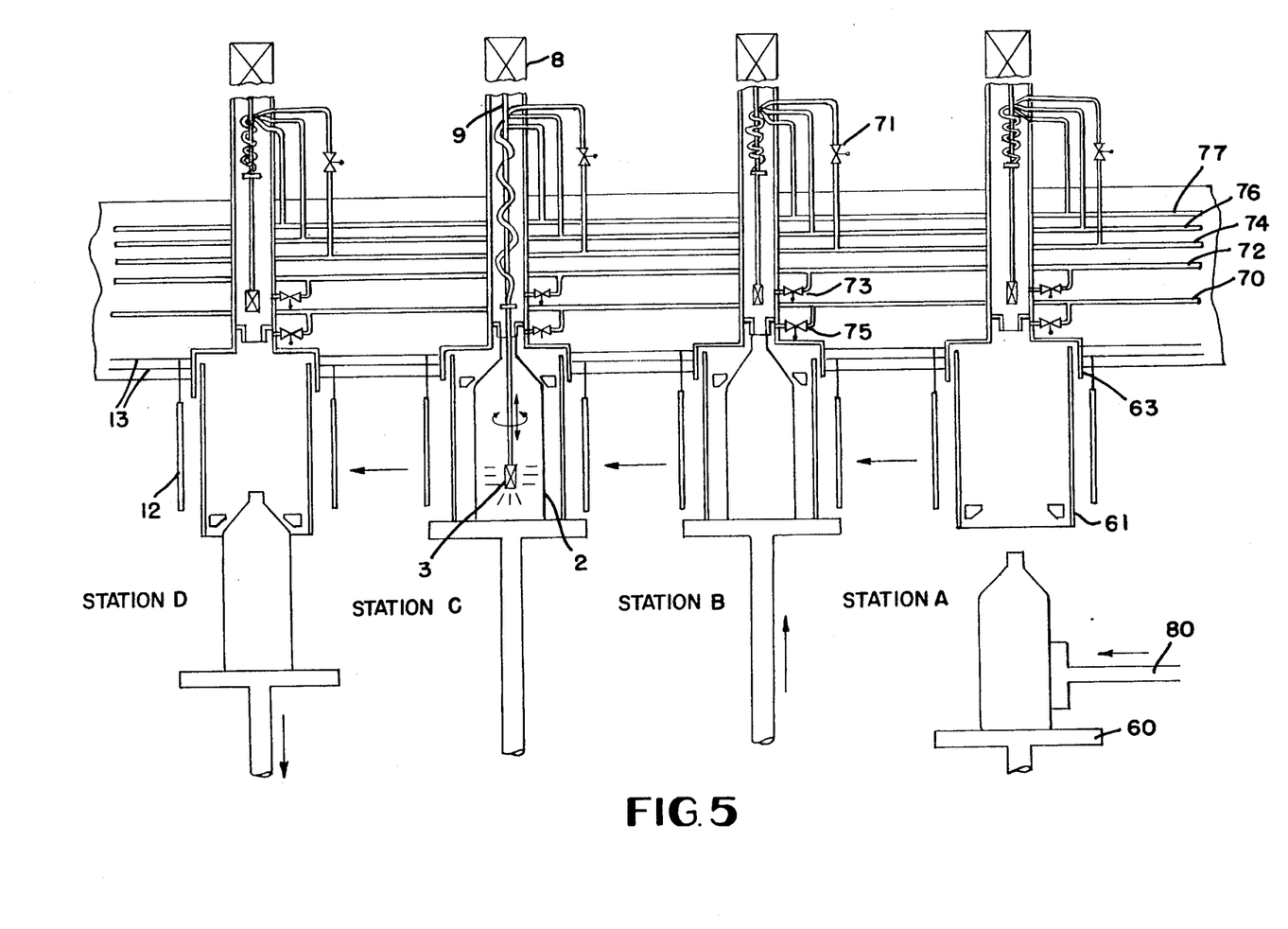
FIG. 5 is a diagram illustrative of a method implemented by the apparatus shown in FIGS. 2–4.

Referring now to FIG. 5, this figure depicts the operation of the apparatus. The apparatus shown in this embodiment is of the well-known rotating "carousel" type, and includes a plurality of coating cells which have a vacuum sleeve 61 and a vacuum sleeve head 63 as already described with respect to FIG. 4A. In position A, a pusher 80, or other similar device, brings container 2 onto the elevator 60. Container 2 is then pushed by the elevator 60 into the chamber formed by the vacuum sleeve and sleeve head 61 and 63. In positions B and C, the sequence controller 79 then activates the evacuation valves 71 and 73, the gas injection valve 75, vaporization energy source 7 (FIG. 1), and plasma production generators 13 or 14, also shown in FIG. 1, in the appropriate order for a coating cycle. In position D, the elevator 60 withdraws and the container 2 is ejected.

Figure 6:
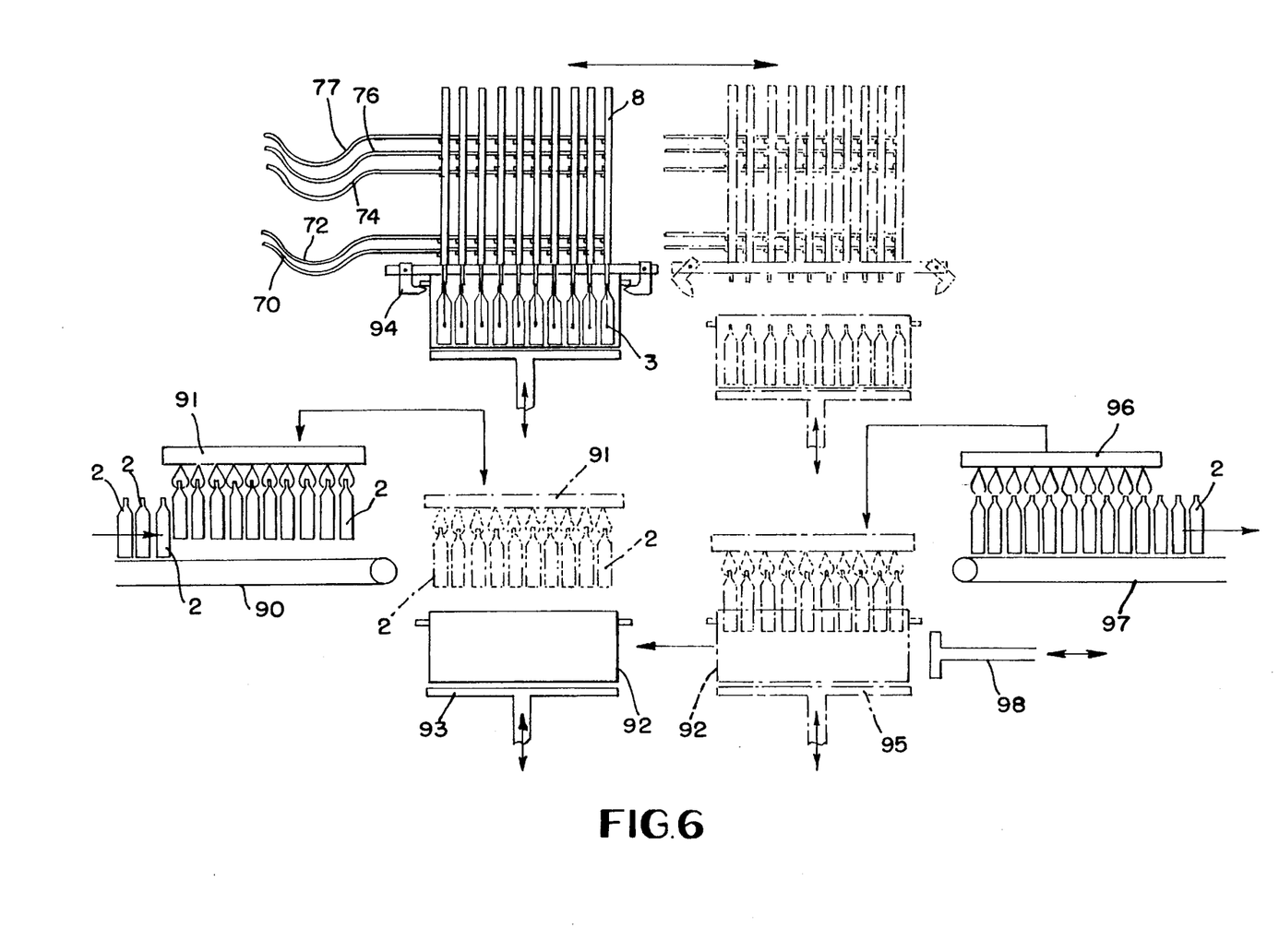
FIG. 6 is a diagram illustrative of a modified method according to the subject invention.

Since certain coating options for container 2 could involve several layers and coating operations, it may be impracticable to carry them out in a rotating "carousel" type of machinery. For example, FIG. 6 illustrates a further embodiment where coating times and complexity of coating operations can be expanded. There a plurality of containers 2 are transported by a conveyor belt 90. A row of containers 2 are gripped by grippers 91 and placed in treatment vessel 92 where they are firmly located by the shape of the partitions in treatment vessel 92. In the embodiment shown, a pusher 93 raises the treatment vessel 92 to a treatment head 94 which grips and tightly seals the top of treatment vessel 92. The treatment head 94 has a multiplicity of all the coating elements described by FIG. 4A, in particular the rotating vaporizer 3, the solenoid motor 8, cooling water distributors 76 and 77, gas distributor 74, vacuum distribution pipes 70 and 72. Each individual container in treatment vessel 92 can be rotated by the manner described by FIGS. 4B, 4C.

After the coating treatment, the coating head 94 moves to a further position to the right where it releases the treatment vessel 92 which is then returned to an unloading position by pusher 95. The containers 2 are then unloaded by grippers 96 onto a finished goods conveyor belt 97 and the empty treatment vessel 92 is now returned by pusher 98 to the left so as to receive a fresh load of containers 2 from gripper 91.

Where there are a multiplicity of treatment vessels 92 and treatment heads 94 according to specific production needs, the cycle can operate either by raising the treatment vessels 92 to the treatment head(s) 94, as shown, or by conveying the treatment vessel 92 horizontally to one or several treatment positions and lowering one or several treatment heads 94 to the treatment vessel 92.

The container or treatment vessel handling details, be it in a "carousel" type device as shown in FIG. 5, or in a linear device as shown in FIG. 6, is state-of-the-art technology and therefore incidental to this invention. This detailed description intends only to demonstrate the principles as illustrated by FIG. 5 and FIG. 6. These are essential to enable containers to be processed by practical means at high speed, while giving the flexibility of coating parameters required to produce the high quality coating criteria described.

Having thus shown and described what is at present considered to be the preferred embodiment of the invention, it should be noted that all modifications, alterations and changes coming within the spirit and scope of the invention as set forth in the appended claims are herein meant to be included.

We claim:

1. A method of coating an internal surface of a temperature sensitive container comprising the steps of:

locating a temperature sensitive container having an internal surface in an evacuated enclosure;

placing a vaporizer containing inert inorganic material inside said temperature sensitive container;

generating a vapor of said inorganic material;

forming a plasma of said vapor; and depositing a relatively thin coating of said inorganic material over said internal surface of said temperature sensitive container, wherein the high temperature of the particles of said coating penetrate said surface due to their heat energy while causing no overall rise in surface temperature because of the low mass flow.

2. The method of claim 1 wherein said step of generating a vapor comprises heating the vaporizer to the sublimation temperature of said material while confining the heat of vaporization to the immediate vicinity of the vaporizer so as not to affect the inner surface of the temperature sensitive container.

3. The method of claim 2 wherein said temperature sensitive container comprises a plastic container.

4. The method of claim 3 wherein said plastic container is comprised of polyethylene terephthalate (PET).

5. The method of claim 3 wherein said step of forming a plasma includes applying a relatively high frequency electrode magnetic field around said temperature sensitive container.

6. The method of claim 3 wherein said step of forming a plasma includes applying a relatively high electrical potential across the vapor formed by said vaporizer.

7. The method as defined by claim 3 wherein said step of depositing a relatively thin coating comprises depositing a thin coating having a thickness ranging between 10–250 nm.

8. The method of claim 3 wherein said inorganic material comprises carbon, metals as well as their oxides, nitrides, sulphides, halides and/or mixtures or combinations thereof.

9. The method of claim 3 and additionally including the step of supplying a gas to the evacuated enclosure which flows into the plasma so as to react with the vapor to provide a coating composition different from that of the material being vaporized.

10. The method of claim 3 and additionally including an initial step of cleaning and/or activating the surface of said temperature sensitive container to be coated prior to generating said vapor and depositing said coating on the inside surface of said temperature sensitive container.

11. The method of claim 3 and additionally including the step of providing a vacuum of between $10^{-1}$ mbar and $10^{-5}$ mbar within the enclosure.

12. The method of claim 2 wherein said plastic container includes a relatively narrow mouth.

13. The method of claim 12 wherein said step of depositing includes moving the vaporizer inside the temperature sensitive container.

14. The method of claim 12 wherein said step of depositing includes moving and/or rotating the vaporizer inside the temperature sensitive container.

15. The method of claim 14 wherein said step of moving the vaporizer inside of the temperature sensitive container includes moving the vaporizer up and down inside of the temperature sensitive container.

16. The method of claim 14 wherein said step of moving the vaporizer inside the temperature sensitive container comprises rotating the vaporizer through a range of at least 30°–90° C.

17. The method of claim 12 and additionally including the step of rotating the temperature sensitive container to prevent heat energy from being concentrated on the walls thereof.

18. Apparatus for coating an inner surface of a temperature sensitive container comprising:

a vacuum chamber;

a vaporizer containing inert inorganic material;

means for inserting and removing the vaporizer from inside a temperature sensitive container having an internal surface;

means for moving the vaporizer while inside said temperature sensitive container;

means for energizing the vaporizer; and means for forming a plasma of said vapor;

wherein a relatively thin coating of said inorganic material is deposited over said internal surface of said temperature sensitive container because the high temperature of the particles of said material penetrate the internal surface of said area while causing no overall rise in surface temperature due to low mass flow of the particles.

19. The apparatus of claim 18 and additional including means for transporting the temperature sensitive container to and from the vacuum chamber.

20. The apparatus of claim 18 wherein said means for moving the vaporizer while inside the temperature sensitive container includes means for moving the vaporizer up and down as well as rotating the vaporizer.

21. The apparatus of claim 20 wherein said temperature sensitive container comprises a narrow mouthed plastic container and said inorganic material is silica, carbon, metals as well as their oxides, nitrides, halides and/or mixtures or combinations thereof.

22. The apparatus of claim 20 wherein said vaporizer comprises a crucible type structure and additionally including:

means for supplying and controlling the flow of the material to said vaporizer;

means for controlling the flow of vapor so that it flows evenly in all directions out of said vaporizer; and means for providing vaporizer cooling so as to prevent the heat of vaporization from reaching said inner surface.

23. The apparatus of claim 18 and additionally including means for rotating the temperature sensitive container to prevent heat energy from being concentrated on the walls of the temperature sensitive container.

* * * * *